(12) United States Patent
Suzuki et al.

(10) Patent No.: US 6,596,381 B2
(45) Date of Patent: Jul. 22, 2003

(54) RESIN BOARD, MANUFACTURING PROCESS FOR RESIN BOARD, CONNECTION MEDIUM BODY, CIRCUIT BOARD AND MANUFACTURING PROCESS FOR CIRCUIT BOARD

(75) Inventors: Takeshi Suzuki, Osaka (JP); Satoru Tomekawa, Osaka (JP); Yoshihiro Kawakita, Osaka (JP); Yasushi Nakagiri, Kyoto (JP); Fumio Echigo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/962,245

(22) Filed: Sep. 26, 2001

(65) Prior Publication Data

US 2002/0037397 A1 Mar. 28, 2002

(30) Foreign Application Priority Data

Sep. 27, 2000 (JP) .................................. 2000-294027

(51) Int. Cl.⁷ .............................. B32B 3/00; H05K 1/00
(52) U.S. Cl. ........................ 428/209; 174/254; 174/258
(58) Field of Search ........................ 428/209; 174/258, 174/254

(56) References Cited

U.S. PATENT DOCUMENTS

| 4,640,866 | A | * | 2/1987 | Suzuki | 428/422 |
| 4,680,220 | A | * | 7/1987 | Johnson | 428/241 |
| 4,751,136 | A | * | 6/1988 | Kamiya et al. | 428/317.1 |
| 4,772,509 | A | * | 9/1988 | Komada et al. | 428/251 |
| 4,983,434 | A | * | 1/1991 | Sassa | 428/36.2 |
| 5,034,801 | A | * | 7/1991 | Fischer | 357/72 |
| 5,512,360 | A | * | 4/1996 | King | 428/304.4 |

FOREIGN PATENT DOCUMENTS

JP  6-268345  9/1994

* cited by examiner

*Primary Examiner*—Cathy Lam
(74) *Attorney, Agent, or Firm*—McDermott, Will & Emery

(57) ABSTRACT

A compression function layer 60 is provided on at least one board surface. The compression function layer 60 adds a function of being compressed by receiving pressure in the direction of the board thickness to the resin board 10 which includes this layer. Thereby a sufficient pressure is applied to conductors 14.

18 Claims, 14 Drawing Sheets

F I G. 13A
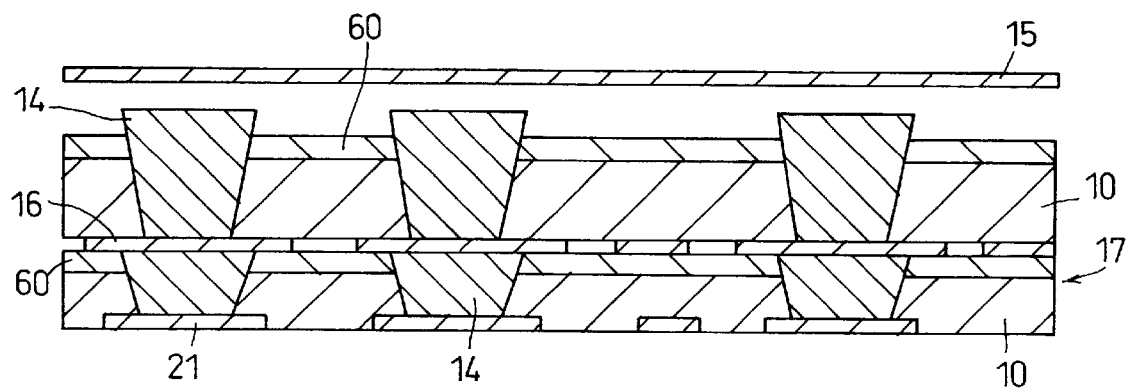
F I G. 13B
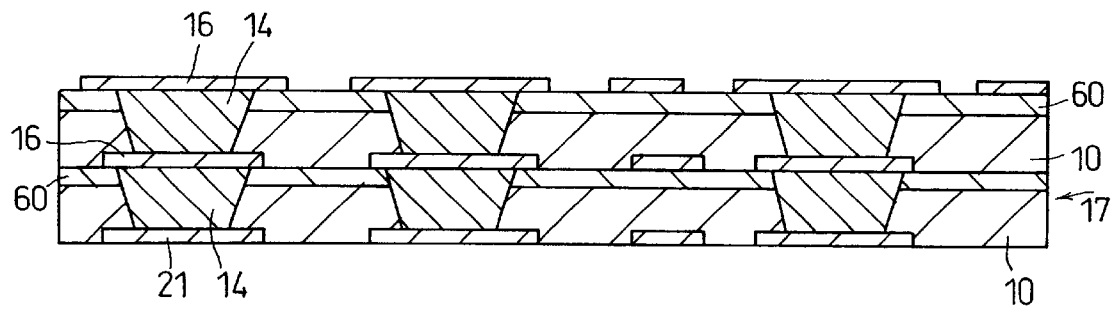

RESIN BOARD, MANUFACTURING PROCESS FOR RESIN BOARD, CONNECTION MEDIUM BODY, CIRCUIT BOARD AND MANUFACTURING PROCESS FOR CIRCUIT BOARD

BACKGROUND OF THE INVENTION

1. Field of the Invention

The present invention relates to a resin board which is used as a circuit board, a connection medium body, a manufacturing process for a connection medium body a circuit board and a manufacturing process for a circuit board.

2. Description of the Related Art

In recent years, together with the miniaturization, reduction of weight, increased functionality and increased performance of electronic devices, the demand has become strong, concerning industrial application as well as concerning application in the broad field of consumer devices, for a multi-layer circuit board on which semiconductor chips such as LSIs can be mounted in high density at an inexpensive price.

A resin multi-layer circuit board which can be supplied less expensively than a ceramic multi-layer board and which can fulfill the above described market demand has attracted attention as a substitute for a conventional ceramic multi-layer board and technological development has been carried out to develop a resin multi-layer circuit board that is a board suitable for high density mounting.

As a resin multi-layer circuit board developed in this manner, a circuit board of an any layer inner via hole construction has been disclosed in Japanese Unexamined Patent Publication No. Hei 06-268345 (1994). This circuit board is a resin multi-layer board using a composite material of aramid non-woven fabric reinforcing material and an epoxy resin as the insulating layer and, therefore, can be supplied at a comparatively inexpensive price. In addition, this circuit board adopts the any layer inner via hole construction, that is to say, an interstitial via hole connection construction which can connect arbitrary positions in wiring layers through conductive paste and, therefore, becomes suitable for high density mounting.

A circuit board of the any layer inner via hole construction having the above characteristics cannot be formed unless a prepreg is used which has voids in the inside due to the impregnation of resin into a non-woven fabric. That is to say, this circuit board has a construction which can be implemented only by using a particular material.

However, in addition to a higher density of mounting, today, market demands have become as follows. That is to say, market demands are manifold and there are demands such as a circuit board of a low dielectric constant suitable for a high speed circuit network, a circuit board of a high heat resistance, and the like. Therefore, it is required to implement a circuit board which has characteristics that fulfill respective desires and suitable for high density mounting.

SUMMARY OF THE INVENTION

Accordingly, the main purpose of the present invention is to provide a circuit board which can implement a low connection resistance and an excellent connection stability.

In order to achieve the above described purpose, the present invention provides a compression function layer on at least one board surface to gain a resin board used in an insulating layer of a circuit board or a connection medium body. The compression function layer has characteristics such that it adds the function of being compressed by receiving pressure in the direction of the thickness to a resin board or a medium connection body.

According to the present invention, a circuit board which adds a compression function and implements a low via connection resistance and an excellent connection stability can be gained without being limited to a specific combination of materials and, rather, can be gained by making the surface have specific characteristics.

The compression function layer is preferably a porous layer. Then, by controlling the degree of invasion of a resin component of the resin board into the porous layer, the function of being compressed by receiving pressure in the direction of thickness can be added to the resin board.

The porous layer has a hole group wherein the hole group is preferably formed of a plurality of holes which are connected to each other so that both ends of the hole group have openings on both sides of the porous layer. Then, air held in the holes can be ejected to the outside through pressure in the direction of the board thickness. Thereby, it can be made easier for the resin component of the resin board to invade into the porous layer and the amount of invasion of this resin component to the porous layer can be easily controlled by adjusting the pressure.

The above described compression function layer can also be formed of a layer of insulating particles which is provided on a resin board or connection medium body in the condition protruding from the board surface. In this case, the insulating particles protruding from the board surface are pressed into the resin board by receiving pressure in the direction of the board thickness and, thereby, the compression function can be added to the resin board.

The resin board is preferably in a semi-cured condition on, at least, the surface on which the compression function layer is provided. Then, because of the semi-cured condition of the board material, advantages are gained as follows. That is to say, in the compression function layer made up of a porous layer, it becomes easier for a resin component to invade into the porous layer. In addition, in the compression function layer made up of insulating particles, it becomes easy to press insulating particles into the resin board.

The resin board is preferably provided with a protective film layer so as to be removable as an additional layer above the above described compression function layer. Thereby, during a manufacturing step for a circuit board using the resin board or the connection medium body, dust from the outside can be prevented from becoming attached to the compression function layer. In addition, the entire thickness of the resin board or the connection medium body can be adjusted through the addition or removal of a protective film layer. Thereby, it becomes possible to add a compression margin at the time when conductors provided through the resin board or the connection medium body in the direction of the thickness is compressed.

A resin board of the present invention can be manufactured as follows. That is to say, after a porous layer is provided on at least one board surface of a resin board, the above described porous layer is adhered to the above described resin board through pressure by applying pressure to the above described resin board of the degree that a resin component of the above described resin board does not invade into the holes of the above described porous layer.

BRIEF DESCRIPTION OF THE DRAWINGS

The other purposes of the present invention will become evident by understanding the below described embodiments and are clearly shown in the attached claims. And, those skilled in the art will perceive a number of advantages that are not touched on in the present specification in the case that this invention is implemented.

FIGS. 13A and 13B are cross sectional views showing, respectively, the steps in another manufacturing process for the multi-layer board;

DETAILED DESCRIPTION OF THE INVENTION

In the following, the preferred embodiments of the present invention are described in reference to the drawings.

First Preferred Embodiment

Figure 1A:
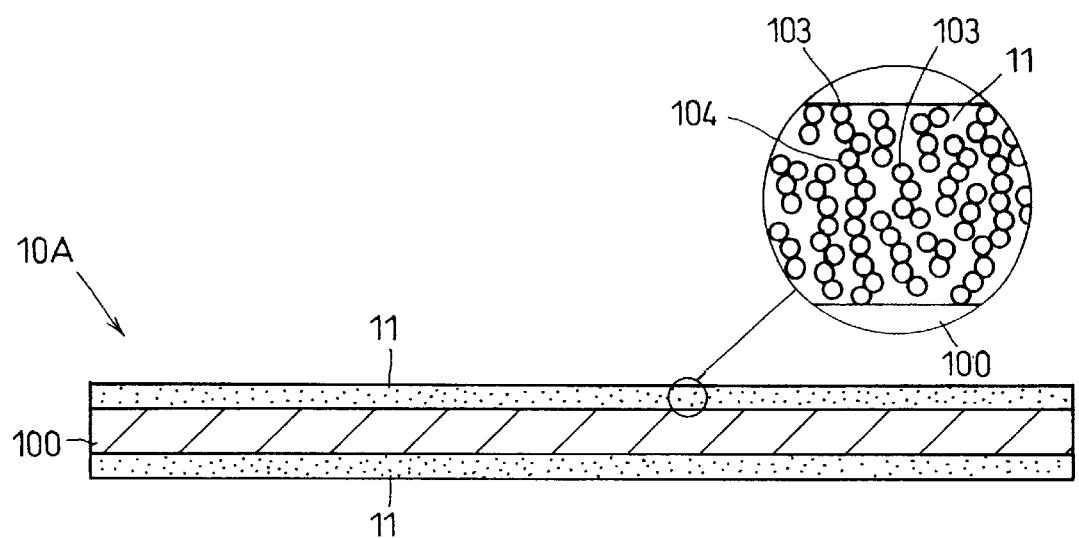
FIG. 1A is a cross sectional view showing a construction of a resin board 10A according to the first preferred embodiment of the present invention.
Figure 1B:
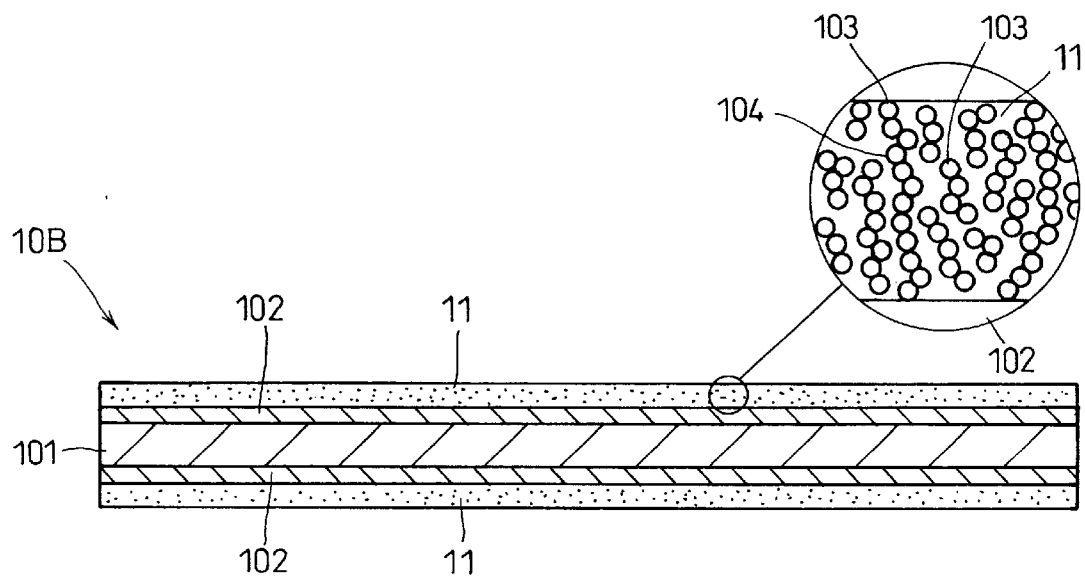
FIG. 1B is a cross sectional view showing a construction of a resin board 10B according to the first preferred embodiment of the present invention.

FIGS. 1A and 1B are cross section schematic views showing a resin board 10 of the present embodiment.

Resin boards 10A and 10B have porous layers 11 on the surfaces. That is to say, the difference between the resin boards 10A and 10B of the present embodiment and a conventional resin board is whether or not a porous layer 11 which becomes a compression function layer is placed on a surface and the resin boards 10A and 10B of the present embodiment have porous layers 11 on, at least, one surface.

Though in the configurations of FIGS. 1A and 1B, the porous layers 11 are provided, respectively, on both sides of the boards 10A and 10B shown as examples, in the case that where a porous layer is provided on only one side, a resin board of the present invention can be gained.

As for the board material of the resin boards 10A and 10B of the present embodiment, a prepreg 100 wherein thermosetting resin is impregnated into a fiber material for reinforcement or an adhesive sheet 101 can be used. An example wherein the prepreg 100 is used is the resin board 10A shown in FIG. 1A while an example where the adhesive sheet 101 is used is the resin board 10B shown in FIG. 1B.

As for the prepreg 100, a glass epoxy prepreg, an aramid epoxy prepreg, or the like, can be cited. The glass epoxy prepreg is gained by impregnating an epoxy resin in a semi-cured (B stage) condition into a glass non-woven cloth. The aramid epoxy prepreg is gained by impregnating an epoxy resin in a semi-cured condition into an aramid non-woven cloth. Here, the epoxy resin in the semi-cured condition has adhesive properties. Therefore, in these prepregs 100 it is not necessary to provide an adhesive layer for adhering the porous layer 11 to the surface of the prepreg 100 as shown in FIG. 1A.

The adhesive sheet 101 is a film board made of thermoplastic resin or a thermosetting resin such as a polyimide, a liquid crystal polymer, an aramid or a PTFE (poly-tetrafluoro-ethylene). As for the resin board 10B made of the adhesive sheet 101, as shown in FIG. 1B, an adhesive layer 102 made of a thermosetting resin or a thermoplastic resin is provided on the surface of the adhesive sheet 101 where a porous film is formed.

The types of thermosetting resin or thermoplastic resin (hereinafter referred to as a prepreg impregnation resin) which are impregnated into the prepreg 100 or the resins forming the adhesive layer 102 which is provided to the adhesive sheet 101 can be selected according to the combinations of the resin boards 10A, 10B and the metal used for wiring layers (described below) and are not particularly limited.

As described below, however, it is necessary to make an adhesive or a prepreg impregnation resin invade into the inside of the spaces of the porous layers 11 from the surrounding area. In order to make these resins invade into the porous layers 11, it is necessary for the prepreg impregnation resin or the adhesive layer 102 to maintain fluidity during the step. Therefore, in the case of a thermosetting resin, it is used in a semi-cured condition. In addition, in the case of a thermoplastic resin, it is made fluid by adjusting the temperature at the time of the step wherein the adhesive is made to flow at the softening temperature point, or greater.

As for the concrete materials for the prepreg impregnation resin or the adhesive layer 102, the following can be cited. That is to say, a thermosetting resin or a thermoplastic resin such as an epoxy resin, a polyimide resin, a phenol resin, a fluorine resin, an unsaturated polyester resin, a PPE (polyphenylene-ester) resin, a bismaleimide tri-azine resin, a cyanate-ester resin can be cited. Here, in the case that a film board of a thermoplastic resin is used as the adhesive sheet 101, the film board itself has adhesive properties at the softening temperature point, or greater and, therefore, the film board itself can also be made to serve as an adhesive layer.

At least one board surface of the resin board 10A, 10B formed in the above manner is provided with a porous layer 11. The porous layer 11 is a compression function layer which adds the function of being compressed by receiving pressure in the direction of the thickness to the resin board 10A, 10B. As for a concrete example of the porous layer 11, a porous sheet of a PTFE (poly-tetra-fluoro-ethylene), a polyimide, an aramid, or the like, or a porous ceramic can be cited.

These porous layers 11 can provide microscopic holes from 1 $\mu$m, or less, to several $\mu$m in the inside thereof. In addition, in that case the size of the holes can be controlled in a highly precise manner.

It is preferable to provide a compression function layer made of the porous layer 11, of which the dielectric constant is small such as a PTFE (poly-tetra-fluoro-ethylene) at the time of the manufacturing of a circuit board used for a high frequency circuit from the following points of view.

That is to say, since the magnetic flux density leaking from the wiring layer is high, the effect of the dielectric loss of the dielectric constant is larger in the surface layer portions closest to the wiring layer of the resin board 10A or 10B than in the inside of the resin board 10A or 10B. Therefore, in the case that the compression function layer of the porous layer 11, or the like, provided in the surface portions of the resin board 10A or 10B is formed of a low dielectric constant material, a high frequency characteristic in a circuit board made of the resin board 10A or 10B can be increased. In addition, by providing the porous layer 11, the mechanical strength of the resin board 10A or 10B can be reinforced.

The porous layers 11 have a plurality of hole groups 103 in the inside thereof. The hole groups 103 are formed by a plurality of holes 104 connected to each other. At least one of these hole groups 103 has openings on both sides of a porous layer 11 on both edges thereof, that is to say, at least one hole group 103 exits from among the hole groups 103 which is in a non-sealed condition that is not sealed in the porous layer 11. Both sides of the porous layer 11 are mutually connected through the hole group(s) 103 formed in the above manner.

Figure 2A:
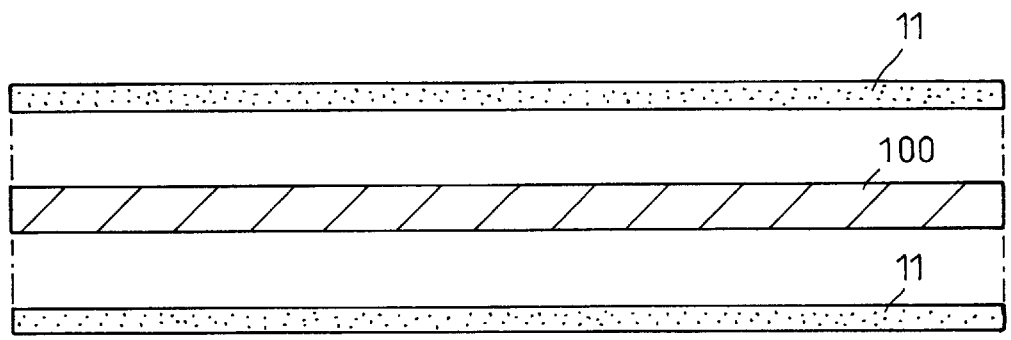
FIG. 2A is a cross sectional view showing a manufacturing process for a resin board 10A.
Figure 2B:
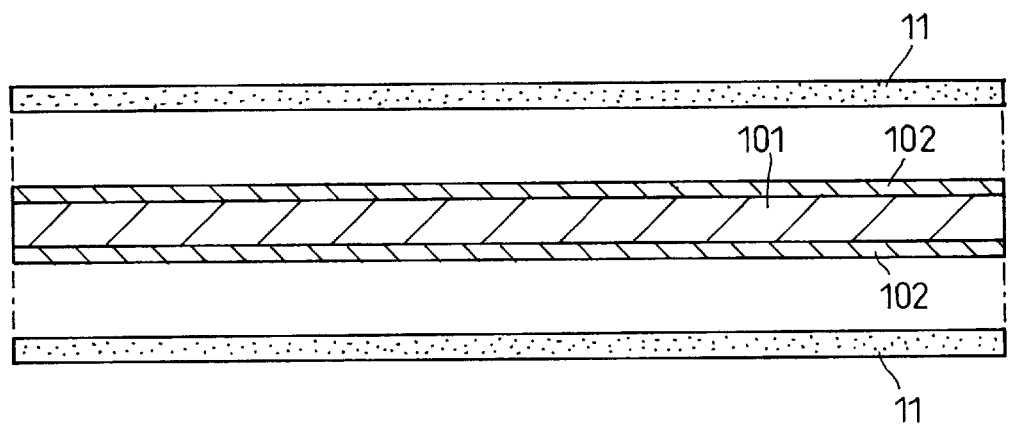
FIG. 2B is a cross sectional view showing a manufacturing process for a resin board 10B.
Figures 1, 12A:
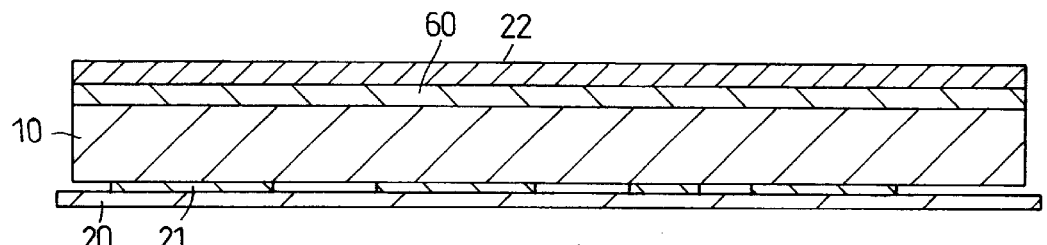
FIGS. 12A-1 to 12D are cross sectional views showing, respectively, the steps in another manufacturing process for the double surface circuit board.
Figures 2, 12A:
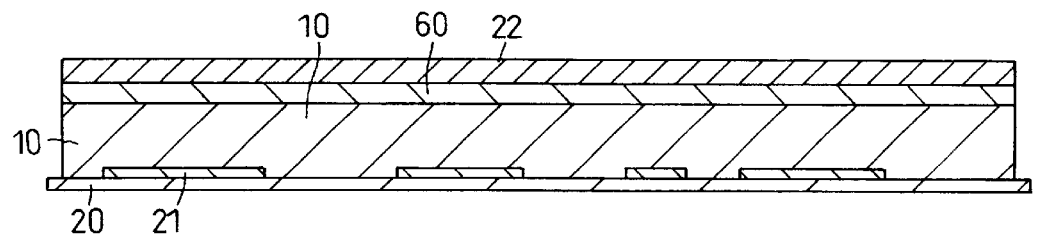

Next, manufacturing processes for the resin boards 10A and 10B are described in reference to FIG. 2. FIG. 2A shows a manufacturing process for the resin board 10A while FIG. 2B shows a manufacturing process for the resin board 10B.

Manufacturing processes for both of the resin boards 10A and 10B are essentially the same. That is to say, compression function layers are layered on both sides of the prepreg 100 or on the adhesive sheet 101 so as to be integrated. Concretely, the porous layers 11 are adhered by applying heat and pressure to both sides of the prepreg 100 or to the adhesive sheet 101. Adhesion by applying heat and pressure can be carried out by, for example, rotating a heated roller in the condition where it is pressed onto the porous layers 11. Here, at the time of adhesion by applying heat and pressure, the pressure applied to the resin board 10A or 10B is to the degree where the resin components of the resin board 10A or 10B hardly invade into the holes 104 of the porous layers 11. Here, the resin components of the resin board 10A or 10B mean resin components forming the impregnation resin of the prepreg 100 or forming the adhesive layer 102.

At the time when the porous layers 11 are adhered to the resin board 10A or 10B through pressure, a protective film layer may be simultaneously formed so as to be removable on, at least, one board surface of the resin board 10A or 10B. In this case, a porous layer 11 is formed on the protective film layer in advance and, after the porous layer 11 is arranged so as to contact a side of the resin board 10A or 10B, the protective film layer is adhered through pressure and, thereby, a resin board having a protective film layer and a porous layer 11 can be manufactured simply with a smaller number of manufacturing steps. As for the conditions of adhesion through pressure at this time, the following conditions can, for example, be set. That is to say, in the case that a PET film (thickness 4 $\mu$m to 25 $\mu$m) is adhered to a glass epoxy prepreg or to an aramid epoxy prepreg through pressure, the feeding speed of the roller heated to the temperature of 100° C. to 140° C. can be set at 1 m/sec to 3 m/sec and the air pressure can be set at 0.5 kgf/cm$^2$ to 5.0 kgf/cm$^2$. The protective film layer and the porous layer 11 may, of course, be formed on both sides of the resin board 10A or 10B. However, an asymmetric arrangement is, of course, possible wherein the porous layer 11 and the protective film layer are both provided on only one of the board surfaces of the resin board 10A or 10B while only the protective film layer is provided on the other board surface.

Second Preferred Embodiment

Figure 3A:
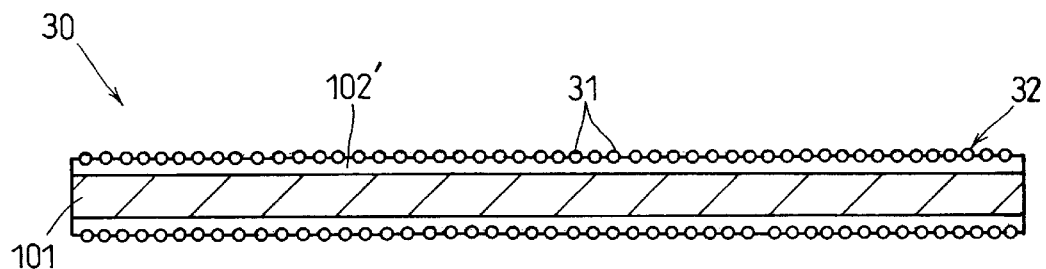
FIG. 3A is a cross sectional view showing a construction of a resin board 30 according to the second preferred embodiment of the present invention.

A resin board 30 according to the second preferred embodiment of the present invention is described in reference to FIG. 3. FIG. 3A is a cross section schematic view showing the resin board 30 which has an insulating particle layer 32 that becomes a compression function layer.

The present embodiment is formed in the same manner as the first preferred embodiment except for that the porous layers 11 in the first preferred embodiment are changed to the insulating particle layers 32.

An insulating particle layer 32 can be formed as follows. That is to say, by adding a plurality of insulating particles 31 to an adhesive layer 102' in the resin board 10B made of the adhesive sheet 101 described in the first preferred embodiment, the insulating particle layer 32 can be formed of this adhesive layer to which the insulating particles are added.

As for the details, the insulating particle layer 32 is formed by adding insulating particles 31 such as silica, alumina or aluminum hydroxide to the adhesive layer 102'. Then, an insulating particle layer 32 formed in this manner is formed on, at least, one board surface of the resin board 10B. At this time, some insulating particles 31 are in the condition of protruding from the surface of the adhesive layer 102'.

Figure 3B:
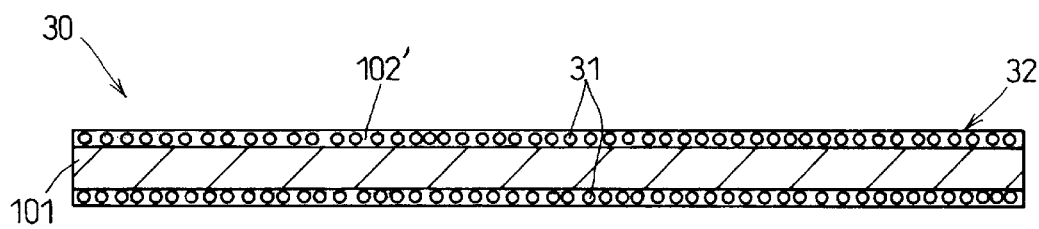
FIG. 3B is a cross sectional view showing a construction of the resin board 30 in the compressed condition.

In the resin board 30 which has such an insulating particle layer 32, as shown in FIG. 3B, the insulating particles 31 are pressed into the inside of the adhesive layer 102' in the subsequent heat compression step. Thereby, the resin board 30 is compressed.

In the case that a similar insulating particle layer to the above described insulating particle layer 32 is provided when the resin board 30 is formed by using the resin board 10A made of the prepreg 100 described in the first preferred embodiment, the following may be carried out.

Figure 3C:
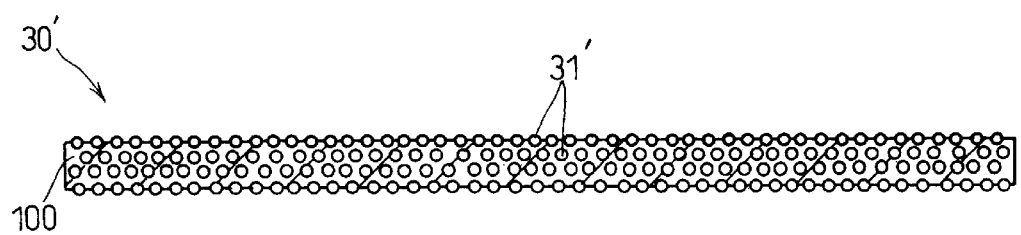
FIG. 3C is a cross sectional view showing another construction of the resin board 30.

That is to say, as shown in FIG. 3C, a resin including insulating particles 31' is used for the resin impregnated into a cloth or a non-woven cloth which becomes a reinforcing material in the prepreg 100. As a concrete example of such a resin board 30', a glass epoxy prepreg including fillers can be used wherein an epoxy resin in which silica particles are diffused is impregnated into a glass cloth.

Third Preferred Embodiment

Figure 4:
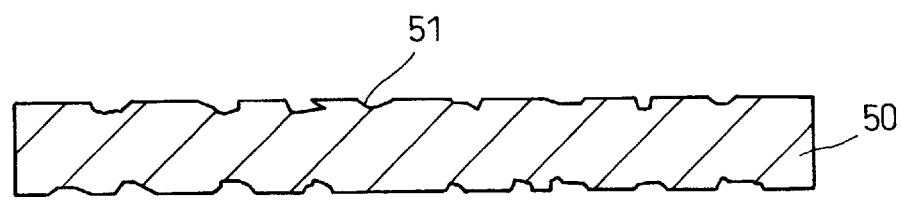
FIG. 4 is a cross sectional view showing a construction of a resin board 50 according to the third preferred embodiment of the present invention.

The third preferred embodiment of the present invention is described in reference to FIG. 4. FIG. 4 is a cross section schematic view showing a resin board 50 which has recesses 51 that function as compression function layers on the surfaces. That is to say, the difference between the resin board 50 of the present embodiment and a conventional resin board for a circuit board is whether or not a surface has a recess 51 and the resin board 50 of the present invention has, at least, one recess 51 on at least one board surface. Though in FIG. 4 an example is shown wherein a plurality of recesses 51 are provided on both sides, the case wherein the recesses are provided on only one side or the case wherein only one recess is provided can also be assumed to be the resin board 50 of the present embodiment.

As described below, the forms or the number of recesses 51 are not particularly limited but, rather, the total volume of the entirety of the recesses becomes important.

As for the material of the resin board 50 of the present embodiment, the same material as resin boards 10A, 10B and 30 in the first and second embodiments can be used.

A method for creating the recesses 51 is not particularly limited and, for example, an adhesive layer is formed on a support body on which protruding parts corresponding to the recesses 51 are provided and, then, after transcribing the adhesive layer onto a film board, the recesses can be created by removing the support body. As for the adhesive layer, a thermosetting adhesive or a thermoplastic adhesive can be used. In the case of a thermosetting adhesive, it is transcribed in a semi-cured condition to create recesses while, in the case of a thermoplastic adhesive, it is heated to the softening temperature point, or greater, at the time of transcription for creating recesses.

In addition, as for another method for creating recesses 51, there is the following method. That is to say, a flat adhesive layer is formed on a film board in advance and, by using a metal mold to which protruding parts are provided corresponding to the positions of the recesses 51, pressure is applied to the mold so as to be pressed to the adhesive layer in a semi-cured condition. After that, by removing the mold, the recesses 51 of a desired size and shape can be provided on desired positions of the adhesive sheet. In addition, in the case of a thermoplastic adhesive, the mold is pressed while being heated to the softening temperature point, or greater.

It is preferable to carry out a mold releasing process in the parts of the above described support body or adhesive layer which contact the adhesive layer. Then, the adhesive becomes easier to be released from the support body or from the mold so that manufacturing a resin board 50 of the present embodiment becomes easier. In addition, in the method for creating recesses 51 with the above described support body or mold, the form, the number, the intervals, or the like, of the recesses 51 can be arbitrarily selected.

As for another method for creating recesses 51, there is the following method. That is to say, after preparing a solution wherein a thermosetting adhesive is diluted by a solvent, a supersonic vibration is given to the solution so as to cause bubbles. The solution containing bubbles is applied to a film board. Then, by drying the solution containing bubbles on the film board, the solvent is volatilized to be in a semi-cured condition. Thereby, the bubble portions become holes so as to create the recesses 51.

As for an example of such a method, there is the following method. That is to say, a supersonic vibration (38 kHz, 150 W) is given to a THF (tetra-hydroxy-furan) solution (30 wt % of solids) of a polyimide-based adhesive so that bubbles are caused. Then, the solution is applied to a film board 13 μm thick) made of polyimide by a gap coater and is dried for one minute at 120° C. Thereby, recesses 51 are formed in the dried solution. The thickness of the solution after being dried is approximately 6 μm.

Furthermore, as for another method for creating recesses 51, there is the following method. That is to say, a light sensitive adhesive layer is formed in a flat manner on a film board in advance. This adhesive layer is covered with a mask which corresponds to the recesses 51 of a desired form and size followed by exposure for developing the non-cured portions. Thereby, recesses 51 are created in the adhesive layer. In this case, the adhesive layer is left in a semi-cured condition. According to this method recesses 51 can be created in a comparatively easy manner.

In the case of a resin board 50 made of a prepreg, recesses 51 can be created by a similar method to a resin board made of an adhesive sheet.

In addition, in the case of the resin board 50 made of a prepreg, since the resin which is contained has adhesive properties, recesses 51 can be created in the resin of the surface layer without forming an adhesive layer. The recesses 51 can be created in a similar manner by using the above described support body or metal mold.

In addition, in the case of a prepreg, recesses 51 can be created through a conventional manufacturing step. That is to say, in a manufacturing process for a resin board 50 using a prepreg, first, a reinforcing material in a sheet form such as a glass cloth or aramid paper is soaked in a solution distilled by a solvent so as to have the desired viscosity and, thereby, a resin board 50 is manufactured. Then, an extra solution is removed from the manufactured resin board 50 by means of a roller, or the like, and, in addition, the board is dried in order to remove the extra solvent. In such a processing step, the resin board 50, before being dried, is passed through a roller which is provided with protruding parts corresponding to the recesses 51. Thereby, the resin board 50 which has recesses 51 on the surface can be easily manufactured.

In addition, in a manufacturing process for a resin board 50 by using a prepreg, recesses 51 can be created as follows. That is to say, the board undergoes sudden heating and drying treatments in the drying step for removing the extra solvent. Thereby, holes are created, after the solvent has been removed therefrom, in the surface of the resin board 50 and these holes become the recesses 51.

As an example of such a manufacturing process, there is the following method. That is to say, an MEK (methyl-ethyl-ketone) solution (60% solids) of an epoxy resin composition for prepreg impregnation is impregnated in an aramid non-woven cloth (basis weight of 72 g/m², 120 μm thick) and, thereby, a resin board 50 is manufactured. Then, the resin board 50 is passed between a pair of rollers which have a gap of 150 μm and, thereby, an extra solution is squeezed out from the resin board 50. After that, the resin board 50 is placed in a dryer which is heated to 200° C. for three minutes. Thereby, recesses 51 are created in the resin board 50.

According to this method no extra steps are necessary for providing the recesses 51 so that the resin board 50 can be inexpensively manufactured.

In the case of the resin board 50 of the present embodiment wherein an adhesive layer is formed on one side or on both sides of a film board, recesses 51 can be created. That is to say, in the step of drying after applying an adhesive layer, holes are caused by suddenly heating and drying the board in the same manner as in the above so that recesses 51 are created in the resin board 50.

Fourth Preferred Embodiment

Figure 5:
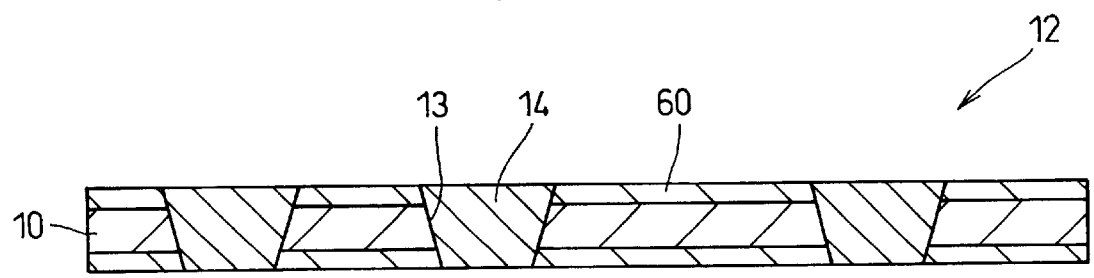
FIG. 5 is a cross sectional view showing a construction of a connection medium body 12 according to the fourth preferred embodiment of the present invention.

Next, a structure of a medium connection body 12 used in the resin boards 10A, 10B, 30 and 50, described in the first to the third preferred embodiments, is described in reference to FIG. 5. Here, in the connection medium body 12 described in the present embodiment in reference to FIG. 5 or in the circuit board described in the below described embodiment, any of the resin boards 10A, 10B, 30 and 50 can be used as a resin board. Therefore, the resin boards 10A, 10B, 30 and 50 are generally referred to as a resin board 10 in the description below or in the figures referred to in the description. In addition, since the porous layer 11, the insulating particle layer 32 or the recesses 51 all function as compression function layers, the porous layer 11, the insulating particle layer 32 or the recesses 51 are all referred to as compression function layer 60 in the description below or in the figures referred to in the description.

The medium connection body 12 is formed by creating through holes 13 in desired positions of a resin board 10 and, after that, by filling these through holes 13 with conductors 14 as shown in FIG. 5. The conductors 14 become interstitial via holes.

As for the conductors 14, conductive paste which contains conductive powder in a resin binder can be used. The conductive paste increases its conductivity through the application of compression.

As for the conductive powder, a powder is used made of, at least, one type of metal selected from among gold, silver, copper, nickel, palladium, lead, tin, indium and bismuth, an alloy of these or a mixture of these. In addition, coat fillers made by coating spheres made of the metal or alloy, oxides such as alumina or silica or organic synthesized resin with the above described metal or alloy may be used as the conductive powder.

The form of the conductive powder is not particularly limited and may be a powder, a fiber, granules, spherical balls, or a mixture of these.

As for the resin used as the resin binder, an epoxy resin in a liquid form, a polyimide resin, a cyanate ester resin, a phenol resol resin, or the like, is used.

As for the epoxy resin, a glycidyl-ether-type epoxy resin such as a bisphenol-A type epoxy resin, a bisphenol-F type epoxy resin or a bisphenol-AD type epoxy resin or an epoxy resin which has two, or more, epoxy groups such as an alicyclic epoxy resin, a glycidyl-amine-type epoxy resin, a glycidyl-ester-type epoxy resin, or the like, is used.

An additive of a solvent or a dispersion agent such as butyl-cellosolve, ethyl-cellosolve, butyl-carbitol, ethyl-carbitol, butyl-carbitol-acetate, ethyl-carbitol-acetate and α-terpineol can, if necessary, be contained in the above described resin.

In addition, the conductors 14 are not limited to the above described conductive paste but, rather, a connection material for interstitial via holes of the type which can gain conductivity through contact by being compressed such as via posts made of a metal such as gold, silver, copper, nickel, palladium, lead, tin, indium and bismuth can be used without a particular limitation.

In the creation of the interstitial via holes in the connection medium body 12, first, through holes 13 are created in desired positions of the resin board 10. As for the method for creating the through holes 13, a conventional hole processing method for circuit boards, a laser processing method by using a carbonic acid gas laser or a YAG laser or a mechanical processing method such as drilling or punching can be used.

In particular, in the case that through holes 13 are created by means of a heat processing laser processing method, the surrounding walls of the through holes 13 can be melted. At this time, in the case that the compression function layer 60 is formed of the porous layer 11, it becomes as follows. That is to say, holes 104 of the porous layer 11 positioned in the surrounding walls disappear due to the melting of the surrounding walls of the through holes. The holes 104 positioned in the surrounding walls of the through holes can become places into which leaking occurs at the time when the conductive paste filled in within the through holes leaks into the surrounding area. Therefore, when the holes 104 of these places are made to disappear, the paste can be prevented from leaking.

However, it is not necessary to completely compress the holes 104. The holes 104 may be compressed to a size such that the conductive powder does not enter into the holes and, thereby, above-described effect of preventing the paste from leaking can be gained and, in addition, the following effect can be gained. That is to say, in the above case resin components in the conductive paste enter into the holes 104 which are allowed to remain in the condition where they become smaller and, as a result, the compression of the conductive paste filled into the through holes 13 is increased so that the resistance of the conductive paste (conductors 14) can be lowered.

Next, conductors 14 are filled into the through holes 13 so that the connection medium body 12 shown in FIG. 5 is completed.

A printing method is used in order to fill in the conductors 14. At this time, a resin board 10 in which through holes 13 are created is placed on a vacuum absorption support via a sheet of paper so that the conductors 14 are filled in through printing. Then, when the connection medium body 12 is compressed during the below described manufacturing step for a circuit board, the density of the conductive particles filled in can be further increased. This is because resin components in the conductive paste 14 are forcefully absorbed into the sheet of paper due to absorption by vacuuming and due to capillary action caused in the sheet of paper and, thereby, the density of the conductive powder filled in is enhanced and gaps are caused among conductive powder particles.

Fifth Preferred Embodiment

Next, the structure of a circuit board using the connection medium body 12 described in the fourth preferred embodiment and the manufacturing process thereof are described. First, a manufacturing process for a two-sided circuit board 17 is described in reference to FIG. 6.

Figure 6A:
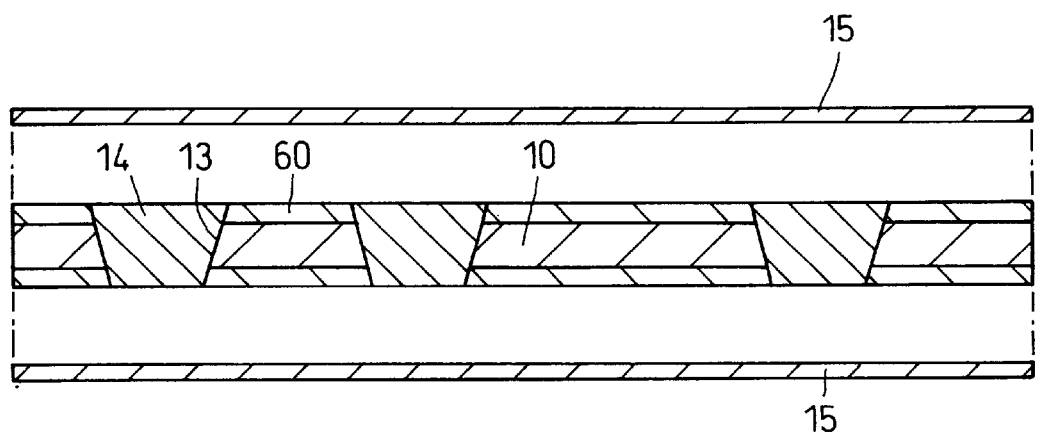
FIGS. 6A and 6B are cross sectional views respectively showing the steps in a manufacturing process for a double surface board 17 according to the fifth preferred embodiment of the present invention.

As shown in FIG. 6A, metal foils 15 for forming wiring layers are overlapped on both sides of the connection medium body 12, which is heated and compressed for adhesion. The conditions for the adhesion through heating and compression differ depending on the structure of the utilized material. For example, in the case that the resin substrate 10 wherein an adhesive layer 102 (approximately 6 μm thick) made of a polyimide-based resin is formed on the resin board 10 made of a polyimide film board (13 μm thick), the board is heated and is compressed for one hour at pressure of 50 kgf/cm² and at a temperature of 200° C.

As for the metal foils 15, copper foils such as an electrolytic copper foil or a rolled copper foil used for a conventional circuit board are used. Though the thickness of the metal foils 15 are not particularly limited, an electrolytic copper foil of 3 μm to 70 μm is readily available and is preferable.

Figure 6B:
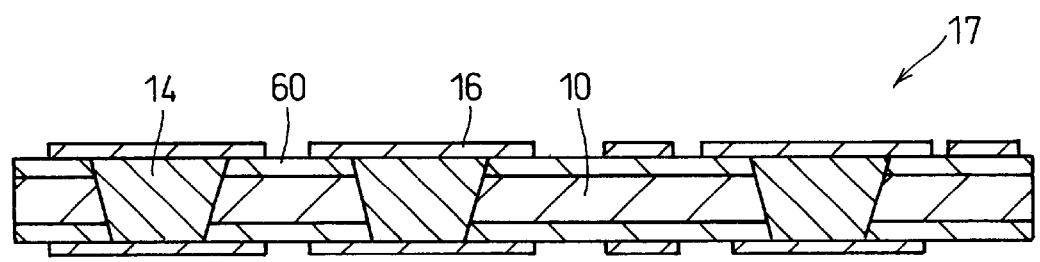

In the above described processing steps, metal foils 15 and the connection medium body 12 are adhered through heating and compression. Next, as shown in FIG. 6B, the metal foils 15 are processed into wiring layers 16 which have desired wiring patterns. Thereby, the two-sided circuit board 17 is completed. As for the processing of the wiring layers 16, a photolithographic method, which is used in a conventional circuit board manufacturing, can be used.

In such a manufacturing process for a two-sided circuit board 17, at the time when the metal foils 15 undergo heating and compression processing, the connection medium body 12 is compressed so that the thickness thereof becomes thinner due to the function of the compression function layer 60. Thereby, the conductors 14 are simultaneously compressed, together with the compression of the connection medium body 12, so that the conductivity thereof is enhanced.

First, a compression addition in the case where the compression function layer 60 is formed of the porous layer 11 is described. In this case, the resin components of the surface portions of the resin board 10 have fluidity and, therefore, pressure is applied to connection medium body 12 in the direction of the thickness and the above described resin components are impregnated into a hole group 103 within the porous layer 11 so that the porous layer 11 sinks into the resin board 10B and of the connection medium body 12 is compressed so that the thickness becomes thinner by the amount of sinkage. Thereby, the conductors 14 are simultaneously compressed, together with the compression of the connection medium body 12, so that the conductivity thereof is enhanced.

Next, a compression addition in the case that the compression function layer 60 is formed of the insulating particle layer 32 is described. In this case, insulating particles 31 are pressed into the inside of the adhesive layer 102' in the heating and compression step. Thereby, the resin board 30 is compressed and the thickness of the connection medium body 12 becomes thinner by the amount of compression. Thereby, the conductors 14 are simultaneously compressed together with the compression of the connection medium body 12 so that the conductivity thereof is enhanced.

Figure 7A:
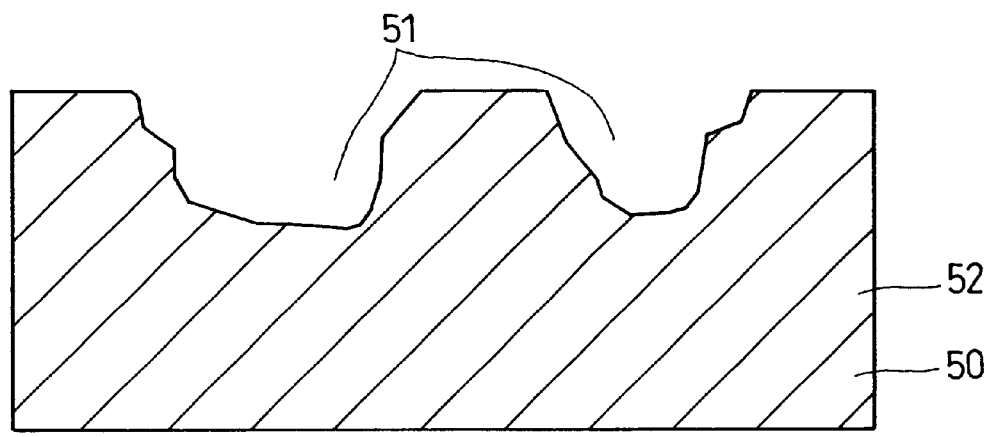
FIGS. 7A and 7B are enlarged cross sectional views of a main part showing, respectively, the condition of a resin component 58 flowing into recesses 51.
Figure 7B:
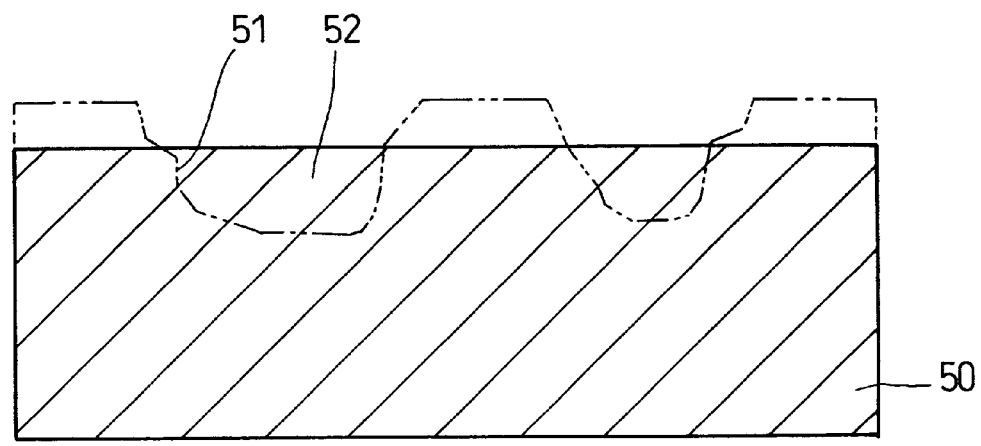

Next, a compression addition in the case that the compression function layer 60 is created from the recesses 51 is described. In this case, the recesses 51 disappear in the heating and compression step. Thereby, the resin board 50 is compressed and the thickness of the connection medium body 12 becomes thinner by the amount of compression. Thereby, the conductors 14 are simultaneously compressed together with the compression of the connection medium body 12 so that the conductivity thereof is enhanced. That is to say, as shown in FIGS. 7A and 7B, the recesses 51, into which the resin components 52 flow into from the surrounding areas, carries out the function of compressing the connection medium body 12 (resin board 50). In this case, it is important to control the entire volume of the recesses 51. In detail, the ratio of the entire volume of the recesses 51, which is occupied in the connection medium body 12, to the entire volume of the connection medium body 12 (entire volume of recesses 51/entire volume of connection medium body 12) is required to be equal to the compression ratio of the connection medium body 12.

It is preferable to set the compression ratio of the conductors 14 as follows. That is to say, in the case that the conductors 14 are used as interstitial via holes, a compression ratio of 5%, or higher, is preferable. It is possible to secure the conductivity of the interstitial via holes with a compression ratio of less than 5%. However, in the case of 5%, or higher, a sufficient pressure is applied to the contact portions among conductive powder particles as well as to the contact portions between the conductive powder particles and the metal foils 15 so as to ensure strong adhesion. Thereby, the connection resistance of the interstitial via holes is lowered. In addition, the stability of the connection is increased.

The two-sided circuit board 17 manufactured in this manner has the following structure. That is to say, the resin board 10 has the compression function layer 60 on, at least, one board surface. The resin board 10 has through holes 13 in the thickness direction. Conductors 14 are filled into the through holes 13. Wiring layers 16, which have desired wiring patterns, are provided on both sides of the resin board 10. The wiring layers 16 on both sides of the resin board 10 are electrically connected to each other through the conductors 14.

Figure 8:
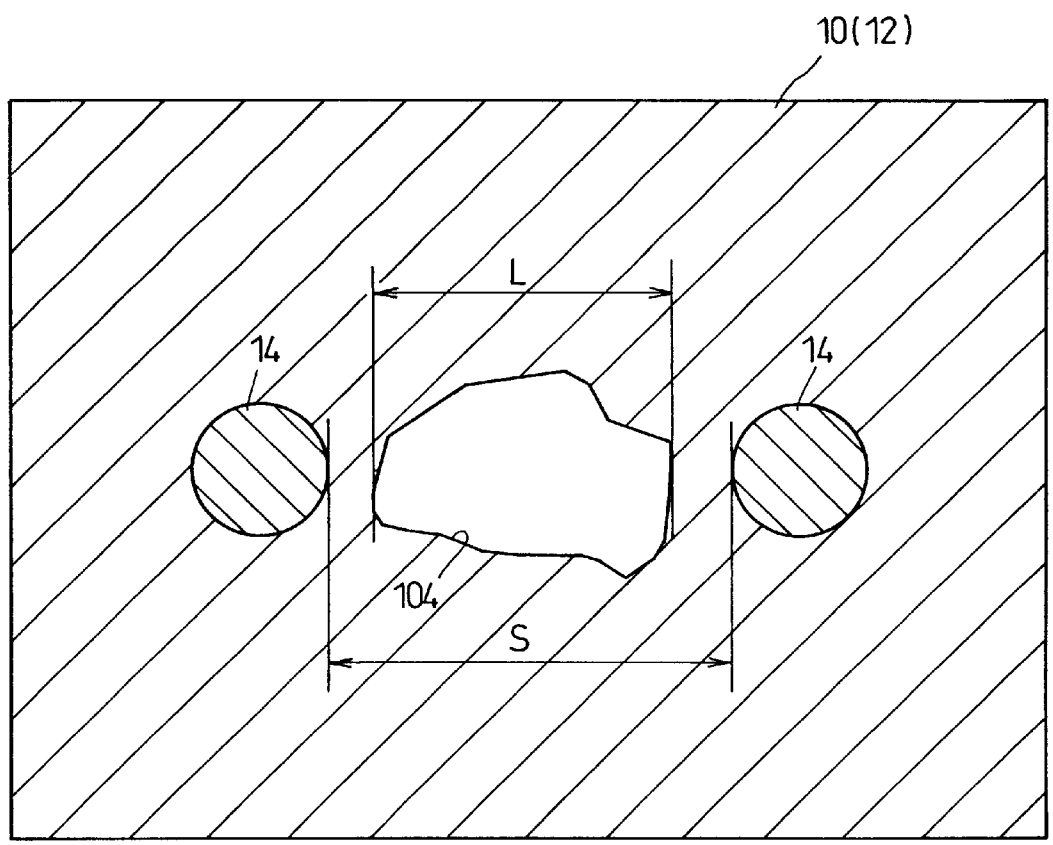
FIG. 8 is a plan view showing the relationships between the maximum diameter L of a hole 104 and the minimum separation interval S of conductors 14.

In the case that the two-sided circuit board 17 is formed, the following is preferable. That is to say, as shown in FIG. 8, it is preferable to make the maximum diameter L of the holes 104, which are components of the hole group 103, smaller than the minimum separation interval S of the conductors 14. In this manner it becomes as follows.

The conductive paste forming the conductors 14 invades into holes 104 by receiving pressure and a short circuit among the conductors 14, due to the conductive paste which has invaded into the holes 104, can be prevented by setting the maximum diameter L as described above.

In the present embodiment, by combining the compression addition effect of the compression function layer 60 and another technology, the compression power can be further enhanced.

For example, during the step of heating and compression the resin board 10, with the metal foils 15 being overlapped, wiring layers 16, which are formed in advance, are pressed into the connection medium body 12 instead of the metal foils 15, that is to say, a so-called transcription method is used.

In detail, as shown in FIG. 9, a so-called wire layer with carrier wherein a wiring layer is formed on a support board 20 can be used. As an example of a wiring layer with carrier, there is an aluminum carrier on which a wiring layer is layered via a mold releasing layer.

Figure 9A:
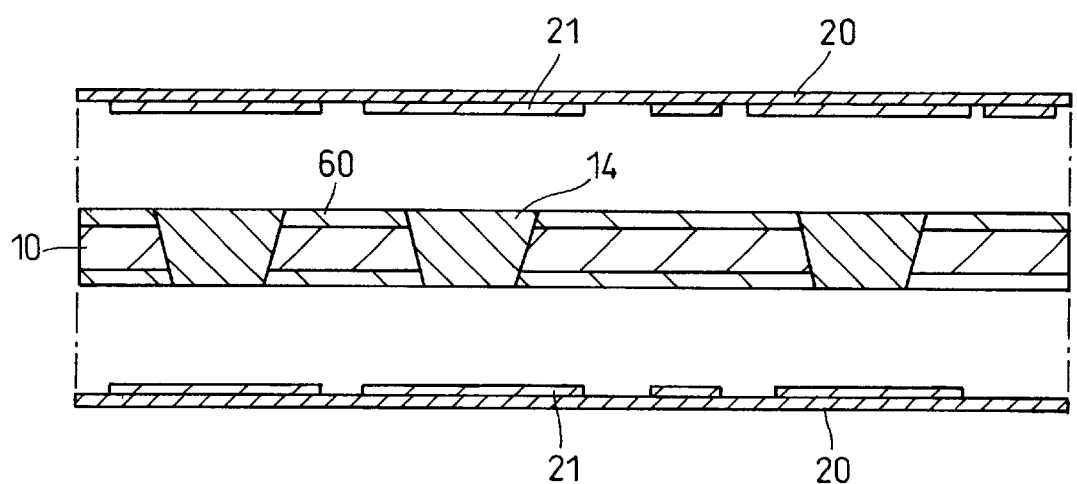
FIGS. 9A and 9B are cross sectional views showing, respectively, the steps in a manufacturing process for a double surface circuit board using a wiring layer with carriers.
Figure 9B:
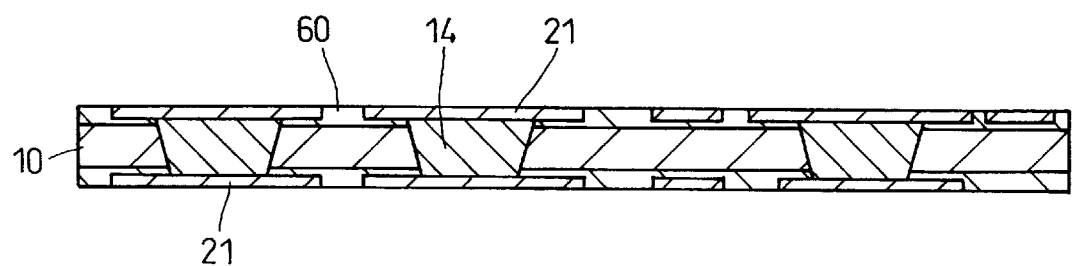

That is to say, as shown in FIG. 9A, a wiring layer 21 is formed by etching a copper foil layered and placed on the support board 20 for patterning by using a ferric chloride solution, an ammonium persulfate solution, or the like. Then, as shown in FIGS. 9A and 9B, after layering the wiring layer 21 so as to be buried in the connection medium body 12, the support body 20 is removed through etching by means of hydrochloric acid.

By using a transcription method, the pressure applied to the conductors 14 in the connection medium body 12 becomes the sum of the pressure due to the porous layer 11 and the pressure due to the pressed in wiring layer 21.

In addition, by using a compressible base material within which there are holes as the resin board 10', a greater pressure can be applied to the conductors 14 due to the synergetic effects with compression addition effect of the porous layer 11 according to the present invention. As for such a resin board 10', a porous film of polyimide or of fluorine resin can be cited.

In addition, as shown in FIG. 10, by making the conductors 14 filled into the through holes 13 protrude from the surface of the connection medium body 12, the pressure applied to the conductors 14 through heating and compression can be further enhanced. This is described in the following.

Figure 10A:
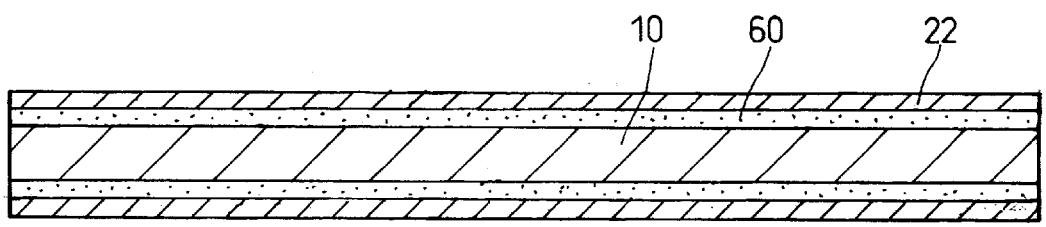
FIGS. 10A to 10D are cross sectional views showing, respectively, the steps in a manufacturing process for a double surface circuit board 17 using protective film layers.

First, as shown in FIG. 10A, a protective film layer 22 made of a film material such as PET (polyethylene-terephthalate), PEN (polyethylene-naphthalate), or the like, and upon which is carried out a mold releasing process (for example, a process using a silicon-based mold releasing agent), is attached to the surface which the board contacts, is attached to, at least, one surface of the resin board 10 which has the compression function layer 60. In the case that the protective film layer 22 is formed of these materials, the protective film layer 22 can be attached to the resin board 10 so as to be removable.

Figure 10B:
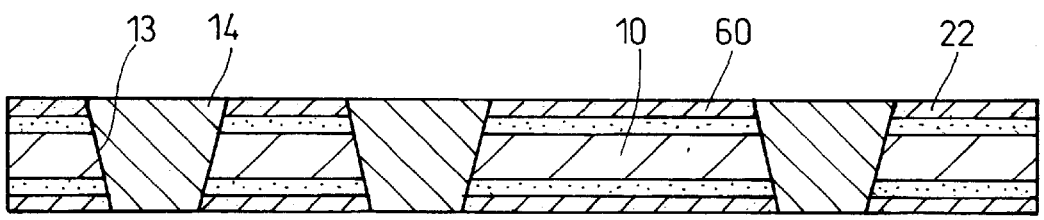

Next, as shown in FIG. 10B, through holes 13 are created in the resin board 10, which includes the protective film layer 22. Then, through a printing method conductors 14 are filled into the through holes 13. At this time the protective film layer 22 works as a mask which prevents the conductors 14 from becoming attached to undesirable portions. Furthermore, the conductors 14 which are filled into the through holes 13 are increased in size by the thickness of the protective film layer 22.

Figure 10C:
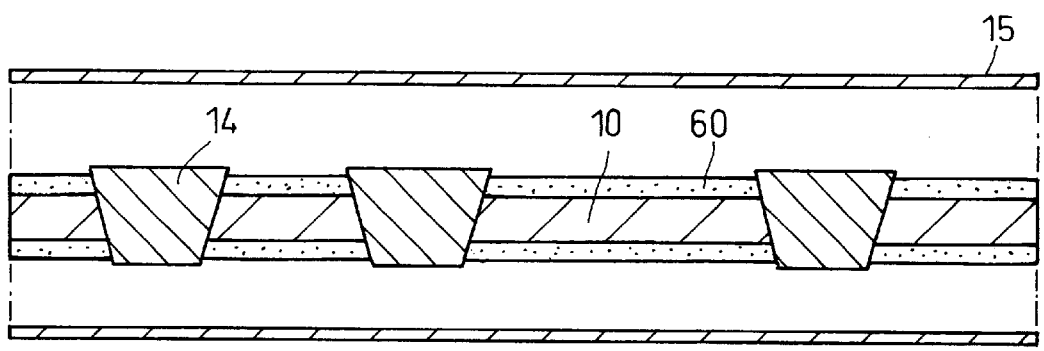

Next, as shown in FIG. 10C, when the protective film layer 22 is removed, the connection medium body 12 wherein the conductors 14 protrude from the through holes 13 is gained. Metal foils 15 are attached to both sides of the resin board 10 in this condition. Then, the metal foils 15 and the resin board 10 are integrated by adhesion through heating and compression. At this time, the conductors 14 protrude from the through holes 13 and, thereby, the portions of the conductors 14 which protrude work during heat compression step so as to enhance the pressure to the conductors 14.

Figure 10D:
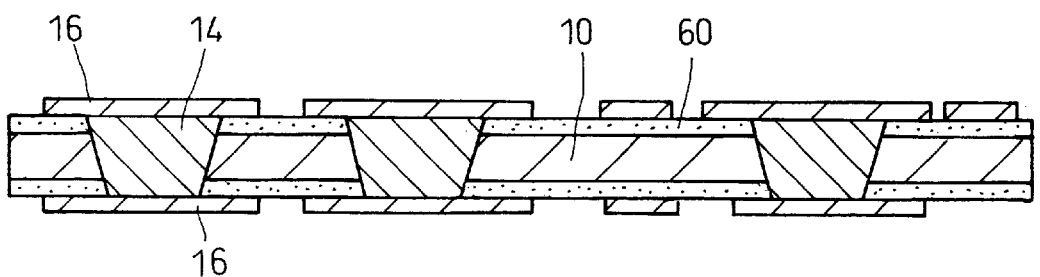

Finally, by patterning the metal foils 15 in the photolithographic step, the metal foils 15 are converted to the wiring layers 16 which have desired wiring patterns. Thereby, the two-sided circuit board 17 shown in FIG. 10D is gained. In this two-sided circuit board 17 the connection reliability of the interstitial via holes is enhanced to a degree equal to the enhanced pressure applied to the conductors 14.

In the above manner, the connection medium body 12 or the two-sided circuit board 17 are formed and in the case that a multi-layer circuit board is manufactured by using these connection medium body 12 or the two-sided circuit board 17, the process becomes as follows.

Figure 11A:
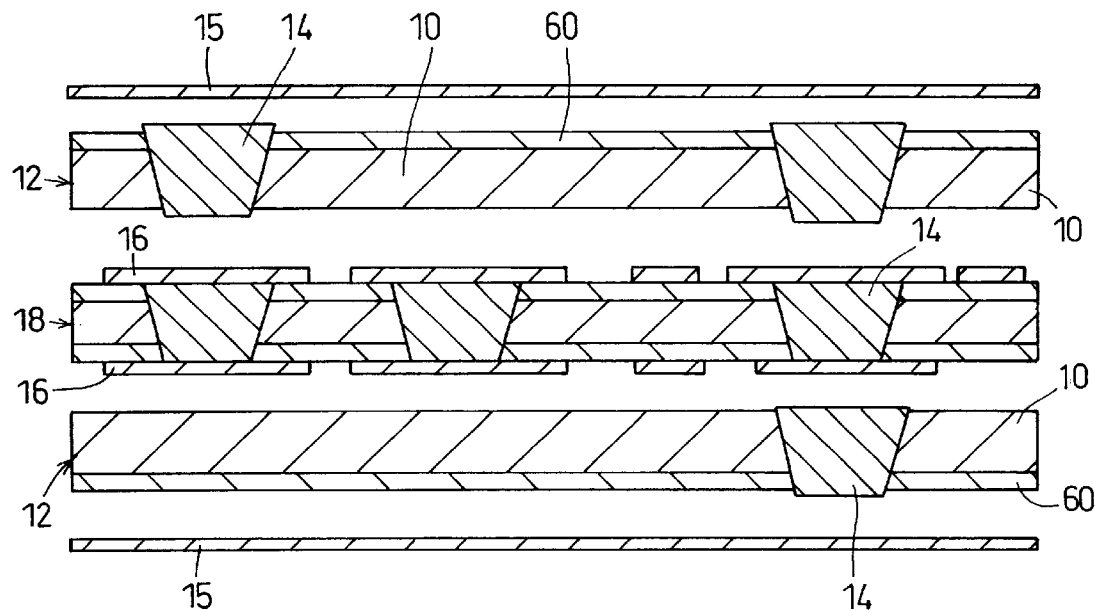
FIGS. 11A and 11B are cross sectional views showing, respectively, the steps in a manufacturing process for a multi-layer board.

As shown in FIG. 11A, the above described two-sided circuit board 17 or a core board 18 made of a conventional two-sided circuit board such as a glass epoxy board is prepared. Then, the connection medium body 12 is overlapped on the wiring layer 16 of the prepared core board 18 and a metal foil 15 is overlapped on top of that so as to be adhered through heating and compression. Thereby, the core board 18, the connection medium body 12 and the metal foil 15 are integrated. Here, it is preferable to use the connection medium body 12 wherein conductors 14 slightly protrude from the medium body surface. Thus the pressure applied to the conductors 14 can be further enhanced.

Figure 11B:
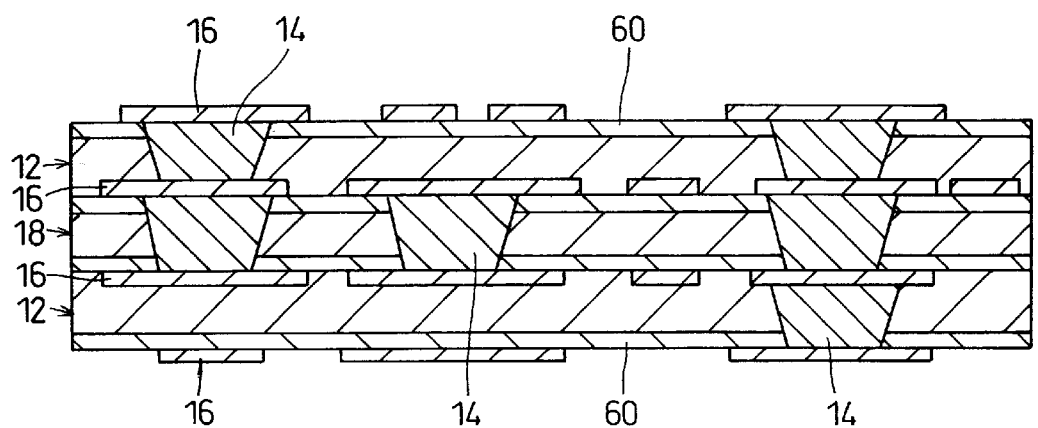

Furthermore, the metal foil 15 is processed into the wiring layer 16 by means of photolithographic method. Thereby, the multi-layer circuit board shown in FIG. 11B is completed. Here, by repeating this method, a number of layers of a circuit board can be easily manufactured.

Next, another manufacturing process for a two-sided circuit board or a multi-layer board is described in reference to FIGS. 12 and 13.

First, a resin board 10 wherein a compression function layer 60 is attached to at least one board surface and a wiring layer 21 which is supported by a support board 20 are prepared. Then, a protective film layer 22 is attached to one board surface of the resin board 10. Here, the protective film layer 22 may be provided on the surface on which the compression function layer is placed or may be provided on the surface on which the compression function layer is not placed. In FIG. 12, as an example, the protective film layer 22 is provided on the surface on which the compression function layer is placed.

Next, as shown in FIGS. 12A-1 and 12A-2, a wiring layer 21 is placed on the surface on which the protective film layer is not placed of the resin board 10. At this time, the wiring layer 21 is positioned with respect to the resin board 10 before it is placed on the board. Here, as shown in FIG. 12A-2, the wiring layer 21 may be placed in the condition where it is partially sunk into the resin board 10 through a compression process. Contrarily, as shown in FIG. 12A-1, the wiring layer 21 may be placed in the condition where it rests on the surface of the resin board 10 without carrying out a compression process. In the case that the wiring layer 21 is placed on the resin board 10 in the condition where it rests on the board surface, the wiring board 21 will be made to sink into the resin board 10 through the below described heat compression step and at that time, the pressure applied to the conductors 14 can be enhanced.

Next, through holes 13 are created in the resin board 10. The through holes 13 are created in the direction of the thickness so as to reach to the wiring layer 21 starting from the surface on which the protective film layer is placed. At this time, the through holes 13 are created in the condition where they are positioned with respect to the wiring layer 21. The through holes 13 can be created by means of a laser processing method using a carbonic acid gas laser, a YAG laser, an excimer laser, or the like. In particular, in the case that the through holes 13 are created by means of heat processing laser processing method, the surrounding walls of the through holes 13 can be melted. At this time, in the case that the compression function layer 60 is formed of a porous layer 11, it becomes as follows. That is to say, holes 104 of the porous layer 11 positioned in the surrounding walls disappear due to the melting of the surrounding walls of the through holes. The holes 104 positioned in the surrounding walls of the through holes can become places into which leaking occurs at the time when the conductive paste filled in within the through holes leaks into the surrounding area. Therefore, when the holes 104 of these places are made to disappear, the paste can be prevented from leaking.

However, it is not necessary to completely compress the holes 104. The holes 104 may be compressed to a size such that the conductive powder does not enter into the holes and, thereby, above-described effect of preventing the paste from leaking can be gained and, in addition, the following effect can be gained. That is to say, in the above case resin components in the conductive paste enter into the holes 104 which are allowed to remain in the condition where they become smaller and, as a result, the compression of the conductive paste filled into the through holes 13 is increased so that the resistance of the conductive paste (conductors 14) can be lowered.

Figure 12B:
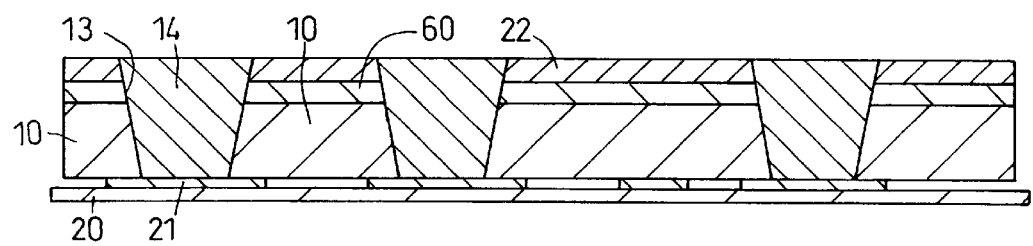

After creating the through holes 13, as shown in FIG. 12B, conductors 14 made of conductive paste are filled into the through holes 13. At the time of the filling in of the conductors 14, in the case that a pressure reduction treatment is applied to the through holes 13 at the time of the filling in or after the filling in, bubbles can be prevented from remaining within the through holes. Such a pressure reduction treatment leads to the high density filling in of the conductors 14.

Figure 12C:
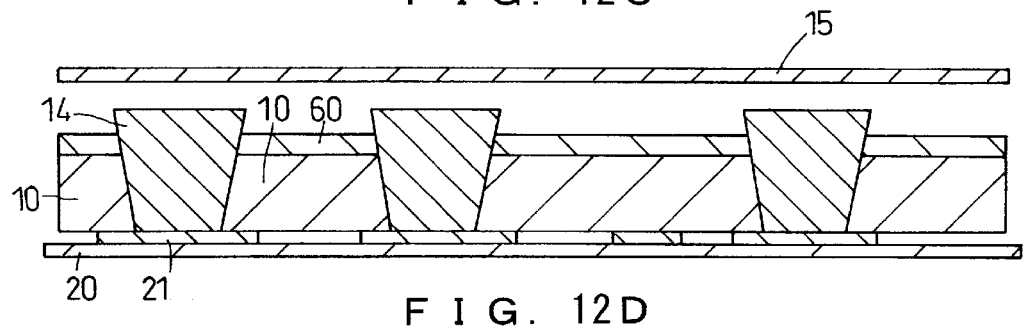

After filling in the conductors 14, the protective film layer 22 is removed. Then, as shown in FIG. 12C, a metal foil 15 is placed on the surface of the resin board 10 from which the protective film layer has been removed and an adhesion treatment through heating and compression is applied. As for the condition of the adhesion treatment through heating and compression, the conditions of the adhesion treatment through heating and compression for a conventional circuit board can be used. For example, the conditions of 180° C. to 250° C., 30 kgf/cm$^2$ to 200 kgf/cm$^2$, 0.5 hours to 2.0 hours can be used.

Figure 12D:
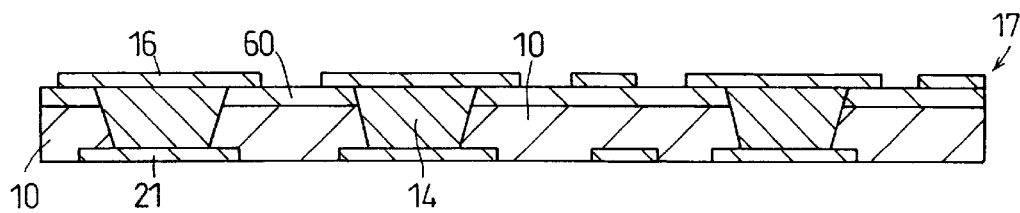

Finally, the metal hole 15 is processed to a wiring layer 16 which has desired wiring patterns by means of a photolithographic method. Then, the support board 20 is removed. Thereby, the two-sided wiring board 17 shown in FIG. 12D is completed.

Since the conductors 14 can be formed according to the position of the wiring layer 16 in the above method, the positioning precision between the wiring layer 16 and the conductors 14 is increased.

In the case that a multi-layer board is formed, it is manufactured as follows.

First, a layered body shown in FIG. 13A is manufactured. This is gained by replacing the wiring layer 21 with a support board with the two-sided circuit board 17 shown in FIG. 12D in the structure of the resin board 10 with a wiring layer shown in FIGS. 12A-1 and 12A-2.

Then, a metal foil 15 is layered on the manufactured layered body. The metal foil 15 is placed on the surface of the layered body on which a wiring layer is not placed.

After placing the metal foil 15 on the above described layered body, the layered body undergoes an adhesion treatment through heating and compression. Then, the metal foil 15 is processed to a wire layer 16 which has desired wiring patterns by means of a photolithographic method. Thereby, a multi-layer board shown in FIG. 13B is gained. Furthermore, by repeating the above described steps, a circuit board of an increased number of layers can be manufactured.

Still another manufacturing process for a circuit board is described in reference to FIGS. 14 and 15.

First, a resin board 10 wherein a compression function layer 60 and a protective film layer 22 are attached to at least one board surface and a core board 18 shown in FIG. 11A are prepared. Then, a layered body is formed by placing and layering the resin boards 10 on both sides of the core board 18. Here, the resin boards 10 are layered as follows. That is to say, the protective film layer 22 is removed from the surface of the resin board 10 which will contact the core board before the resin board 10 is layered on the core board 18. Or the resin board 10 is layered on the core board 18 in the condition that the resin board 10 is placed in the direction where the surface on which the protective film layer is not formed contacts the two-sided circuit board 17.

Figure 14A:
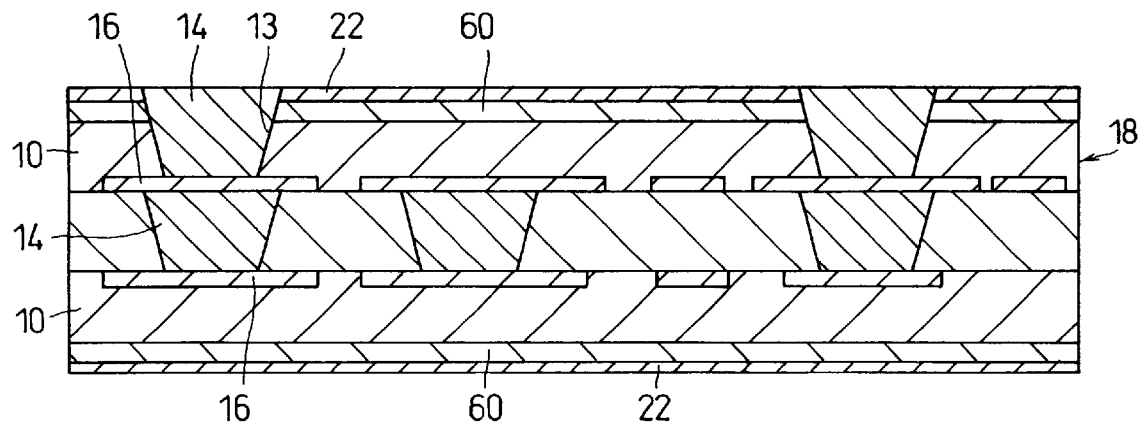
FIGS. 14A to 14C are cross sectional views showing, respectively, the steps of the first half in still another manufacturing process for the multi-layer board.
Figure 14B:
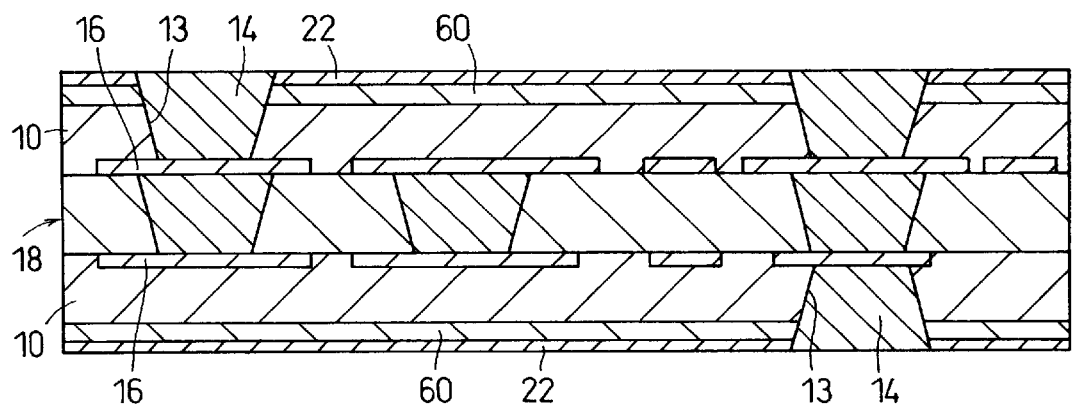

Then, as shown in FIGS. 14A and 14B, through holes 13 are created in the respective resin boards 10 which are placed and layered on the core board. The through holes 13 are created in the condition where they are positioned with respect to the wiring layers 16 which lay on the bottoms of the through holes. That is to say, the through holes 13 are created in the direction of the thickness of the resin boards 10 so as to reach to the wiring layers 16.

Figure 14C:
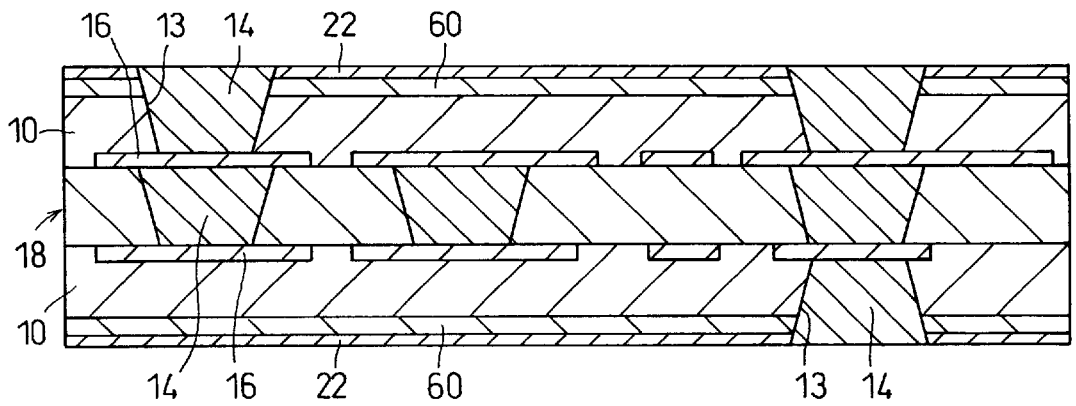
Figure 15A:
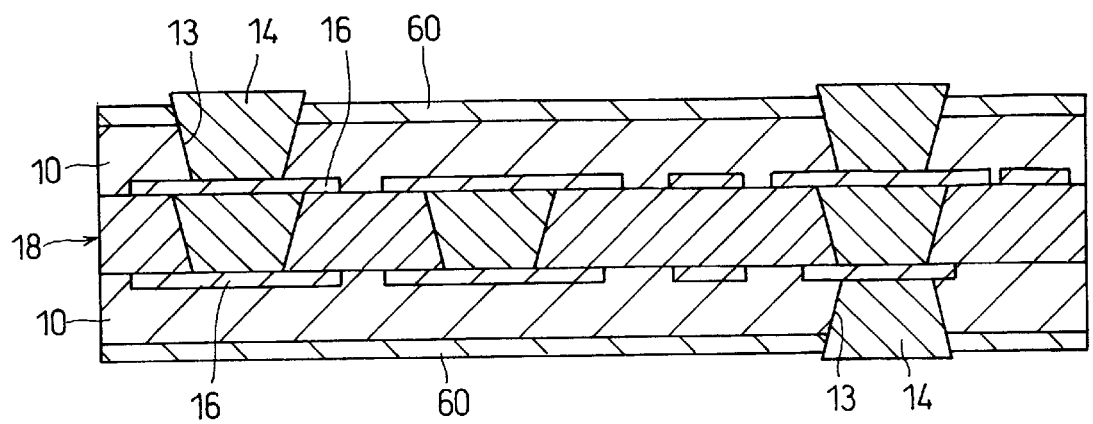
FIGS. 15A and 15B are cross sectional views showing, respectively, the steps of the second half in the manufacturing process directly above for the multi-layer board.

After creating the through holes 13, as shown in FIGS. 14C and 15A, conductors 14 are filled into respective through holes 13. After that, the protective film layers 22 are removed.

Figure 15B:
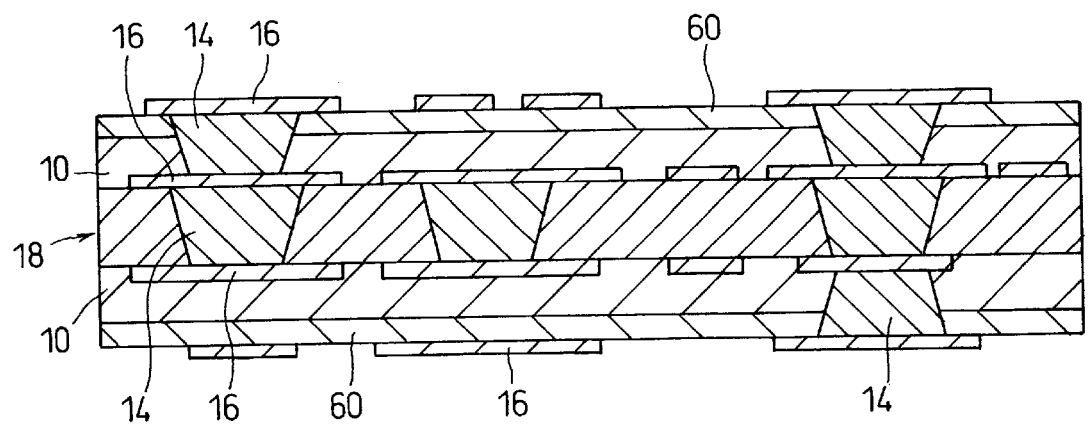

After removing the protective film layers 22, metal foils 15 (not shown) are placed on both sides of this layered body. Then, by making the layered body undergo an adhesion treatment through heating and compression, the layered body and the metal foils 15 are integrated. Finally, the metal foils 15 are processed into wiring layers 16 which have desired wiring patterns by means of a photolithographic method. Thereby, the multi-layer board shown in FIG. 15B is completed.

Next, the reason why it is advantageous in a structure of a circuit board to provide a compression function layer of the present invention, represented by the porous layer 11, is described.

First, the first reason is described. In a board structure wherein interlayer connections are made of conductors, which are made of conductive paste, it is essential to compress the conductors in some fashion. Conventionally, a prepreg having holes inside is used as the resin board and this prepreg is compressed so as to compress the conductors. That is to say, by applying pressure to the prepreg, the holes are crashed so as to shrink the dimension of the prepreg in the thickness direction and, thereby, the conductors are compressed.

In the case that a large number of holes exist inside of the resin board, however, dimensional change easily occurs due to temperature change, moisture change or external force. It is desirable for the dimensional change during a manufacturing step for a circuit board to be as small as possible because it is a cause of processing step defects such as pattern shift. In this manner, holes created in the resin board itself become a factor that causes the circuit board easily change in form, which is disadvantageous in a manufacturing step for a circuit board that requires a higher density and a higher precision in wiring.

Contrarily, as for the resin board 10 of the present invention wherein a compression function layer 60 such as a porous layer 11 is provided on a surface, the board itself can be formed of a resin in a solid condition (condition with non holes) and, therefore, the dimension change can be reduced and a higher density of the circuit board can be sufficiently achieved.

Next, the second reason is described. The higher the density is made in the circuit board, the narrower become the separation intervals between the conductors. As described above in reference to FIG. 8, in the case that holes exist among the conductors and the maximum diameter of the holes is larger than the minimum separation interval between the conductors, adjoining conductors may be short-circuited by the conductive paste which has invaded into a hole.

However, it is not easy to highly precisely control the size of the holes in a prepreg and, in particular, it is difficult to create microscopic holes in a highly precise manner. Therefore, in the configuration of a circuit board to which a compressibility is given by creating holes in a prepreg, it becomes more difficult to make the diameter of the holes smaller than the separation intervals among conductors as the density of mounting becomes higher. As a result, the risk of short-circuit between conductors due to the conductive paste invading into a hole increases in a circuit board of which the density has been made higher. In this manner, the creation of holes in the resin board is not acceptable because as the density of mounting becomes higher, short-circuits are increasingly caused.

Contrarily, in a resin board 10 of the present invention where a compression function layer 60 (in particular, porous layer 11) is provided on a surface, the sizes of holes 104 can be controlled in a highly precise manner so that microscopic holes 104 can be created in a highly precise manner. Therefore, by providing a porous layer 11 which has such holes 104, a short-circuit due to the conductive paste invading into the holes 104 can be prevented even in the case that the density of mounting has become higher in the circuit board.

In addition, in the case that the porous layer 11 is provided, the mechanical strength of the resin board 10 can be reinforced.

As described above, according to the present invention, advantageous effects can be gained that a resin board and a connection medium body provided with a low connection resistance of inner via holes and an excellent connection stability as well as a circuit board using the above resin board or connection medium body can be implemented.

Though this invention is described in detail with respect to the most preferred embodiment thereof, the combination and arrangement of the components in the preferred embodiment can be modified in a variety of manners without deviating from the spirit and the below claimed scope of this invention.

What is claimed is:

1. A resin board for use as an insulating layer of a circuit board, wherein:
   a compression function layer is provided on at least one board surface and this compression function layer adds a function of being compressed by receiving pressure in the direction of the board thickness to the resin board which includes the layer, said compression function layer is a porous layer, said porous layer having a hole group formed of a plurality of holes which are connected to each other and both edges of the hole group have openings on both sides of the porous layer.

2. The resin board according to claim 1, wherein
   said compression function layer is a layer of insulating particles provided in this resin board in the condition of protruding from the board surface.

3. The resin board according to claim 1, wherein the resin board is in a semi-cured condition at least on the surface on which the compression function layer is provided.

4. The resin board according to claim 1, wherein a protective film layer that is removable is provided as an additional layer above said compression function layer.

5. The resin board according to claim 1, further comprising a metal film disposed on at least a portion of said compression function layer.

6. A connection medium body for being provided between two wiring layers that are placed so as to face each other and for electrically connecting these wiring layers, comprising:
   a resin board;
   a compression function layer is provided on at least one board surface of said resin board, said compression function layer is a porous layer, said porous layer having a hole group formed of a plurality of holes which are connected to each other and both edges of the hole group have openings on both sides of the porous layer;
   through holes created in he direction of the thickness of said resin board; and
   conductors provided in said through holes,
   wherein said compression function layer adds a function of being compressed by receiving pressure in the direction of the thickness to the connection medium body which includes this layer.

7. The medium connection body according to claim 6, wherein
   said compression function layer is a layer of insulating particles provided in said resin board in the condition of protruding from the board surface.

8. The medium connection body according to claim 6, wherein the resin board is in a semi-cured condition at least on the surface on which the compression function layer is provided.

9. The medium connection body according to claim 6, wherein at least one of said wiring layers is disposed on at least a portion of said compression function layer.

10. A connection medium body for being provided between two wiring layers that are placed s as to face each other and for electrically connecting these wiring layers, comprising:
    a resin board;
    a porous layer provided n at least one board surface of said resin board, said porous layer having a hole group formed of a plurality of holes which are connected to each other and both edges of the hole group have openings on both sides of the porous layer;
    through holes created in the direction of the thickness of said resin board; and
    conductors provided in said through holes.

11. The medium connection body according to claim 10, wherein at least one of said wiring layers is disposed on at least a portion of said porous layer.

12. A circuit board, comprising:
    a resin board;
    a compression function layer provided on at least one board surface of said resin board, said compression function layer is a porous layer, said porous layer having a hole group formed of a plurality of holes which are connected to each other and both edges of the hole group have openings on both sides of the porous layer;
    through holes created in he direction of the thickness of said resin board;
    conductors provided in said through holes; and
    wiring layers which are provided on both sides of said resin board and which are electrically connected to each other via said conductors,
    wherein said compression function layer is compressed by receiving pressure in the board direction of the thickness to the resin board which includes the layer.

13. The circuit board according to claim 12, wherein the size of the holes of said porous layer is smaller than the minimum separation interval of adjoining said through holes.

14. The circuit board according to claim 12, wherein said compression function layer is a layer of insulating particles provided in this resin board in the condition of protruding from the board surface.

15. The circuit board according to claim 12, wherein at least one of said wiring layers is disposed on at least a portion of said compression function layer.

16. The circuit board according to claim 12, wherein a resin component invades into holes of said porous layer so as to subduct said porous layer in a resin board.

17. A circuit board, comprising:

a resin board;

a porous layer provided on at least one board surface of said resin board, said porous layer having a hole group formed of a plurality of holes which are connected to each other and both edges of the hole group have openings on both sides of the porous layer;

through holes created in he direction of the thickness of said resin board;

conductors provided in said through holes; and wiring layers which are provided on both sides of said resin board and which are electrically connected to each other via said conductors.

18. The circuit board according to claim 17, wherein at least one of said wiring layers is disposed on at least a portion of said porous layer.

* * * * *

UNITED STATES PATENT AND TRADEMARK OFFICE
CERTIFICATE OF CORRECTION

PATENT NO. : 6,596,381 B2
DATED : July 22, 2003
INVENTOR(S) : Takeshi Suzuki et al.

It is certified that error appears in the above-identified patent and that said Letters Patent is hereby corrected as shown below:

<u>Column 18,</u>
Line 8, change "he" to -- the --
Line 29, change "s" to -- so --
Line 33, change "n" to -- on --
Line 54, change "he" to -- the --

<u>Column 20,</u>
Line 4, change "he" to -- the --

Signed and Sealed this

Twentieth Day of April, 2004

JON W. DUDAS
*Acting Director of the United States Patent and Trademark Office*